(12) United States Patent
Owen

(10) Patent No.: US 12,609,654 B2
(45) Date of Patent: Apr. 21, 2026

(54) MICROWAVE GENERATOR DRIVER LIMITER

(71) Applicant: Advanced Energy Industries, Inc., Denver, CO (US)

(72) Inventor: Christopher Michael Owen, Chandler, AZ (US)

(73) Assignee: Advanced Energy Industries, Inc., Denver, CO (US)

( * ) Notice: Subject to any disclaimer, the term of this patent is extended or adjusted under 35 U.S.C. 154(b) by 531 days.

(21) Appl. No.: 18/114,172

(22) Filed: Feb. 24, 2023

(65) Prior Publication Data

US 2023/0344386 A1 Oct. 26, 2023

Related U.S. Application Data

(60) Provisional application No. 63/334,925, filed on Apr. 26, 2022.

(51) Int. Cl.
*H03F 1/02* (2006.01)
*H03F 3/21* (2006.01)

(52) U.S. Cl.
CPC ............. *H03F 1/0216* (2013.01); *H03F 3/21* (2013.01); *H03F 2200/171* (2013.01); *H03F 2200/451* (2013.01)

(58) Field of Classification Search
CPC .... H03F 1/0216; H03F 3/21; H03F 2200/171; H03F 2200/451; H03F 2200/129; H03F 2200/204; H03F 2200/211; H03F 2200/258; H03F 3/195; H03F 3/213
USPC .......................................................... 330/297
See application file for complete search history.

(56) References Cited

U.S. PATENT DOCUMENTS

| | | | | |
|---|---|---|---|---|
| 5,179,264 | A | 1/1993 | Cuomo | |
| 7,445,690 | B2 | 11/2008 | Kasai | |
| 11,646,177 | B2 | 5/2023 | Kaplan | |
| 2008/0180169 | A1 * | 7/2008 | Ripley | H03F 1/0233 330/285 |

OTHER PUBLICATIONS

Shane Thomas, International Search Report, Jul. 18, 2023, Alexandria Virginia.
PCT, International Preliminary Report on Patentability issued in PCT/US2023/018190, Nov. 7, 2024, 7 pages.

* cited by examiner

*Primary Examiner* — Andrea Lindgren Baltzell
*Assistant Examiner* — Khiem D Nguyen
(74) *Attorney, Agent, or Firm* — NOD Law PC

(57) ABSTRACT

A microwave power generator comprises a driver stage having a driver transistor and an output stage coupled to the driver stage and having a power amplifier. A driver limiter is coupled to a DC voltage supply and includes a resistor coupled between the DC voltage supply and the driver transistor. The resistor has a resistance value effective to reduce a DC voltage supplied by the DC voltage supply to a control voltage that is applied to the driver transistor to set an output power of the driver transistor at a level effective to drive the power amplifier of the output stage to its maximum output power without exceeding a maximum input power rating of the power amplifier.

20 Claims, 5 Drawing Sheets

MICROWAVE GENERATOR DRIVER LIMITER

CLAIM OF PRIORITY UNDER 35 U.S.C. § 119

The present application for patent claims priority to Provisional Application No. 63/334,925 entitled "SYSTEM AND METHOD FOR ADJUSTING A DRIVER AMPLIFIER STAGE" filed Apr. 26, 2022, and assigned to the assignee hereof and hereby expressly incorporated by reference herein.

BACKGROUND

Field

This disclosure relates generally to microwave generators, and more particularly to a driver limiter for controlling the output power of a driver stage of the microwave generator to maximize the power output of the output stage power amplifier without exceeding its maximum input power rating.

Background

A microwave power generator is a device that generates high-power microwave energy, typically in the gigahertz range, for various applications. A microwave power generator may be used in a semiconductor plasma process to generate high-frequency electromagnetic waves that ionize a gas in a plasma processing chamber. This ionization creates a plasma of charged particles that can be used to etch or deposit material onto a semiconductor wafer. The microwave generator supplies the power needed to sustain the plasma and control the processing conditions, such as gas flow, pressure, and temperature.

A microwave power generator typically comprises a power amplifier in the output stage that is susceptible to failure when driven beyond its maximum input and output power ratings. The output stage power amplifier is typically driven by a microwave driver transistor that must drive the output stage power amplifier to its maximum output power capability to satisfy the power requirements of the plasma processing chamber. The power amplifier is part of a regulated output power control loop that can sometimes cause the microwave power amplifier to be overdriven under certain conditions, such as large changes in plasma load impedance, or fast changes in setpoint frequency when frequency sweeping due to power amplifier gain variation over frequency.

The driver transistor may generate output power of a magnitude (about 15 watts, for example) that exceeds the maximum input power rating (about 11 watts, for example) of the output stage power amplifier and thus may cause damage to or destroy the output stage power amplifier. Nevertheless, it is important that the driver transistor generate an output power that is sufficient to drive the output stage power amplifier to its maximum power output.

SUMMARY

One aspect of this disclosure may be characterized as a microwave power generator comprising a driver stage having a driver transistor coupled to an output stage having a power amplifier. A driver limiter coupled to the driver stage includes a resistor coupled between a DC voltage supply and the driver transistor. The resistor has a resistance value effective to reduce a DC voltage supplied by the DC voltage supply to a control voltage that is applied to the driver transistor to set an output power of the driver transistor at a level effective to drive the power amplifier of the output stage to its maximum output power without exceeding a maximum input power rating of the power amplifier.

In one implementation, the resistance value of the resistor is about 13 ohms, the DC voltage supplied by the DC voltage supply is about 50 volts, the control voltage applied to the driver transistor is about 43 volts, and the output power of the driver transistor is about 11 watts. In one example, the resistor may be comprised by six resistors connected in series, with each of the six resistors having a resistance of about 2.2 ohms.

In a further implementation, the driver stage comprises a first capacitor coupled between an input node of the driver stage and the driver transistor, and a second capacitor coupled between the driver transistor and an output node of the driver stage. The first and second capacitors have values that keep the driver stage stable and spurious free without attenuating a passband frequency of the driver stage.

In a further implementation, the driver limiter comprises a third capacitor coupled between an output node of the resistor and ground. The third capacitor has a capacitance value effective to minimize overshoot and undershoot of a pulsed RF signal while providing sufficient RF filtering. In one example, the capacitance value of the third capacitor is about 0.1 microfarads.

In a further implementation, the driver limiter comprises a choke inductor coupled between the output node of the resistor and the driver transistor to prevent RF leakage from the driver stage into the driver limiter stage.

In a further implementation, the driver limiter comprises a fourth capacitor coupled between the input node to the resistor and ground. The fourth capacitor has a bulk capacitance value that maintains a stable voltage level and smooths out any high frequency noise.

In a further implementation, the driver transistor is a gallium nitride transistor having a peak frequency of about 2.7 GHz and a peak output power level of about 15 W.

Another aspect of this disclosure may be characterized as a method for optimizing an output power of a driver transistor of a microwave generator. The method comprises: coupling a resistor between a DC power supply and the driver transistor; setting a resistance value of the resistor to provide a control voltage at an output node of the resistor that is reduced relative to an output voltage of the DC power supply; and applying the control voltage to the driver transistor to set the output power of the driver transistor at a level effective to drive a power amplifier of an output stage coupled to the driver transistor to its maximum output power without exceeding a maximum input power rating of the power amplifier.

A further aspect of this disclosure may be characterized as a driver limiter for a driver transistor of a microwave power generator. The driver limiter comprises power dissipation means configured to be coupled between a DC voltage supply and the driver transistor. The power dissipation means reduces a DC voltage supplied by the DC voltage supply to a control voltage that is applied to the driver transistor to set an output power of the driver transistor at a level effective to drive a power amplifier of an output stage of the microwave generator to its maximum output power without exceeding a maximum input power rating of the power amplifier.

In one implementation, the power dissipation means comprises a resistor coupled between the DC power supply and the driver transistor. The resistor has a resistance of about 13 ohms.

In a further implementation, the power dissipation means comprises six resistors coupled in series between the DC power supply and the driver transistor. Each of the six resistors has a resistance of about 2.2 ohms.

In a further implementation, RF filtering means are coupled between the power dissipation means and the driver transistor. The RF filtering means minimizes overshoot and undershoot of a pulsed RF signal and prevents RF leakage from the driver transistor into the power dissipation means and the DC power supply.

In a further implementation, the RF filtering means comprises a capacitor coupled between the power dissipation means and ground, and a choke inductor coupled between the power dissipation means and the driver transistor.

Further aspects of this disclosure are depicted in the accompanying drawings and description and will be apparent based thereon.

BRIEF DESCRIPTION OF THE DRAWINGS

The drawings accompanying this disclosure are not necessarily to scale; emphasis is instead placed on illustrating the concepts disclosed herein. Like reference characters may refer to the same parts throughout the drawings. The drawings depict only illustrative examples of this disclosure and are not limiting in scope.

DETAILED DESCRIPTION

The word “exemplary” is used herein to mean “serving as an example, instance, or illustration.” Embodiments described herein as “exemplary” should not be construed as preferred or advantageous over other embodiments and are not intended to be exhaustive or to limit the description to the precise form disclosed. All voltage, current and power levels, component specifications, etc. set forth herein are merely exemplary of many possible implementations.

Figure 1:
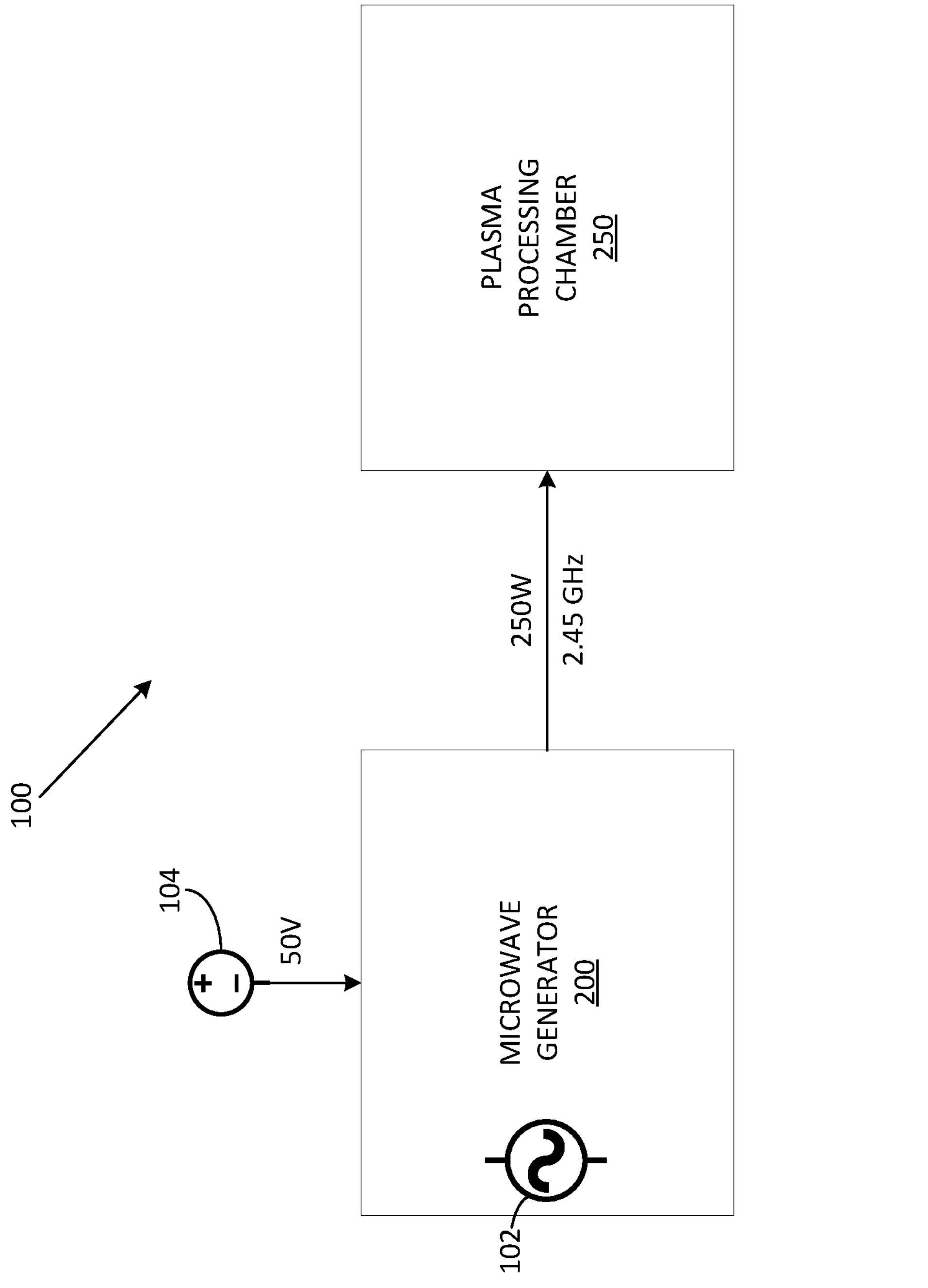
FIG. 1 is a conceptual block diagram of a microwave generator and a plasma processing chamber, in accordance with aspects of this disclosure

FIG. 1 is a conceptual block diagram 100 of a microwave generator 200 and a plasma processing chamber 250, in accordance with aspects of this disclosure. In some implementations, an impedance matching network may be connected between microwave generator 200 and plasma processing chamber 250. Microwave generator 200 receives an input electrical signal from AC power source 102 and generates a high-frequency, high-power signal that is processed and used in a semiconductor plasma process to ionize a gas in plasma chamber 250. This ionization creates a plasma of charged particles that can be used to etch or deposit material onto a semiconductor wafer.

In some implementations, power source 102 generates a continuous, carrier wave (CW) sinusoidal signal input to microwave generator 200, and in other implementations, power source 102 generates a pulsed sinusoidal signal input to microwave generator 200. These are merely examples of the types of waveforms that may be input to microwave generator 200; other types of waveforms may be input to microwave generator 200 and are within the scope of this disclosure. In one non-limiting example, AC power source 102 is a 2-phase power supply with a voltage of 208V, and the signal input to generator 200 has an RF power range of about −3.2 dBm (decibels relative to one milliwatt) to about 10 dBm.

The output signal generated by microwave generator 200 generally mirrors the source signal but at a much higher power level. Thus, the output signal generated by generator 200 may be a continuous, carrier wave (CW) sinusoidal signal, a pulsed sinusoidal signal, or another suitable type of waveform. In one non-limiting example, microwave generator 200 generates a signal of up to 250 W at 2.4-2.5 GHz that is supplied to plasma processing chamber 250.

Microwave generator 200 also receives an input DC voltage from DC power source 104. As will be explained in more detail herein, the DC voltage supplied by power source 104 is used to control the output power of the driver stage of microwave generator 200. In one non-limiting example, power source 104 supplies a DC voltage of about 50V to microwave generator 200.

Figure 2:
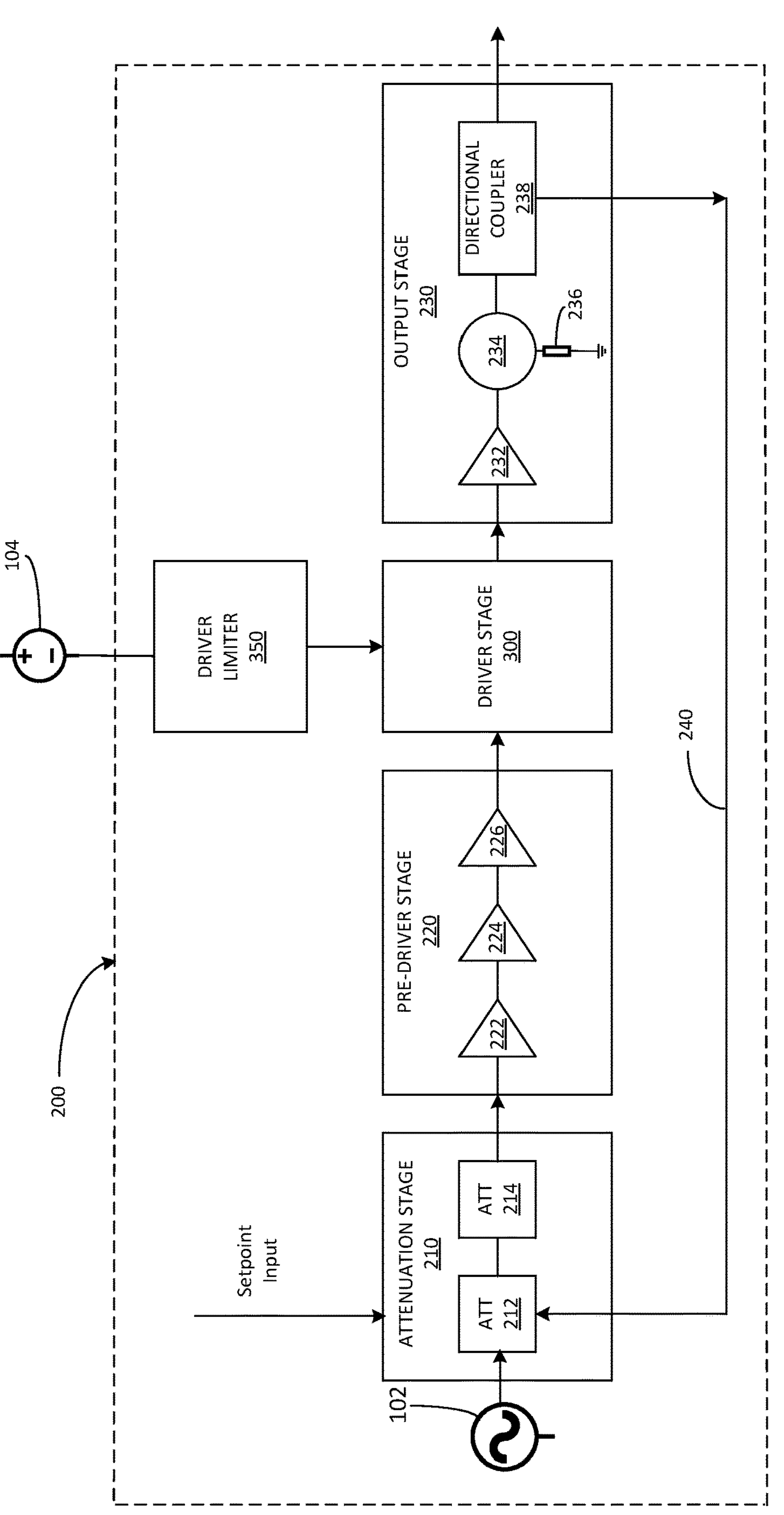
FIG. 2 is a conceptual block diagram of the microwave generator of FIG. 1, in accordance with aspects of this disclosure.

FIG. 2 is a conceptual block diagram of microwave generator 200 of FIG. 1, in accordance with aspects of this disclosure. Microwave generator 200 (also referred to as a microwave power generator 200) comprises attenuation stage 210, pre-driver stage 220, driver stage 300, driver limiter 350, and output stage 230. In this regard, it should be noted that FIG. 2 illustrates only one output channel of microwave generator 200. Microwave generator 200 may have additional output channels as is appropriate to a given application. In one non-limiting example, microwave generator 200 may have 19 output channels, each capable of providing up to 250 W at 2.4-2.5 GHz. As shown, the driver stage 300 and output stage 230 comprise a portion of a regulated control loop that regulates the output of the microwave generator 200 based upon the feedback control signal 240 relative to the setpoint input.

Attenuation stage 210 receives the input power signal from power source 102 and a feedback control signal 240 from one or more sensors (e.g., directional coupler 238) of output stage 230 and produces a source signal that varies based upon the setpoint. Attenuation stage 210 adjusts (attenuates) the power of the signal supplied to pre-driver stage 220 as needed based on the input power signal from power source 102 and the feedback control signal 240. Attenuation stage 210 comprises at least one RF attenuator. While two attenuators 212, 214 are depicted for exemplary purposes in FIG. 2, attenuation stage 210 may alternatively comprise other numbers of attenuators. In one non-limiting example, attenuators 212, 214 are voltage variable attenuators (VVAs) having an attenuation range of about 32 dB, and the signal output by attenuation stage 210 has an RF power range of about −7.2 dBm to about −54 dBm.

Pre-driver stage 220 amplifies the signal received from attenuation stage 210 to a level suitable to drive driver stage 300. As one of ordinary skill in the art will appreciate, the source signal received by the driver stage 300 varies based upon the setpoint input to the attenuation stage 210. Pre-driver stage 220 comprises at least one pre-amplifier. While three pre-amplifiers 222, 224, 226 are depicted for exemplary purposes in FIG. 2, pre-driver stage 220 may alternatively comprise other numbers of pre-amplifiers. In one non-limiting example, the pre-amplifiers of pre-driver stage 220 collectively provide a total gain of about 55 dB, and the signal output by pre-driver stage 220 has an RF power range of about 30 dBm to about 0 dBm.

Driver stage 300 comprises a driver transistor that is controlled by driver limiter 350 to have an output power effective to drive output stage 230 to its maximum power output without exceeding the maximum power input rating of output stage 230 and thereby possibly causing damage or failure of output state 230. Driver stage 300 and driver limiter 350 are described in more detail below with reference to FIG. 3.

Output stage 230 comprises power amplifier 232, circulator 234 and directional coupler 238. In one non-limiting example, power amplifier 232 is a GaN (gallium nitride) amplifier optimized for 2.4-2.5 GHz signal operation and with peak output power levels of up to 300 W (54.8 dBm). As mentioned above and explained in more detail below, driver limiter 350 controls and optimizes the output power of driver stage 300 to drive power amplifier 232 to its maximum output power without exceeding the maximum input power of power amplifier 232. The power amplifier 232 is configured to receive (from the driver stage 300) an amplified representation of the source signal (received at the driver stage 300).

Circulator 234 improves the power handling and performance of generator 200 by isolating plasma mismatches and preventing reflected signals from causing damage or affecting signal quality. It essentially acts as a one-way valve, allowing microwave energy to flow from power amplifier 232 to plasma processing chamber 250, and preventing microwave energy from flowing in the reverse direction. Load resistor 236 is connected to the third port of circulator 234 to absorb reflective energy and ensure that it is not reflected into generator 200. In one non-limiting example, load resistor 236 has a value of 50 ohms.

Directional coupler 238 is coupled to the output of circulator 234 and measures forward and reflected power. For example, the directional coupler 238 may measure a 250 W output signal of microwave generator 200, which is transmitted by a cable or other transmission line to plasma processing chamber 250. Directional coupler 238 is also connected by feedback control loop 240 to attenuation stage 210 and allows generator 200 to measure and control the output power. If coupler 238 senses a plasma mismatch, for example, feedback control loop 240 may control attenuation stage 210 to attenuate power to prevent too much reverse power, damage, or failure. Directional coupler 238 forms a part of a power regulation control loop wherein attenuation stage 210 is controlled to reach a given power setpoint.

Figure 3:
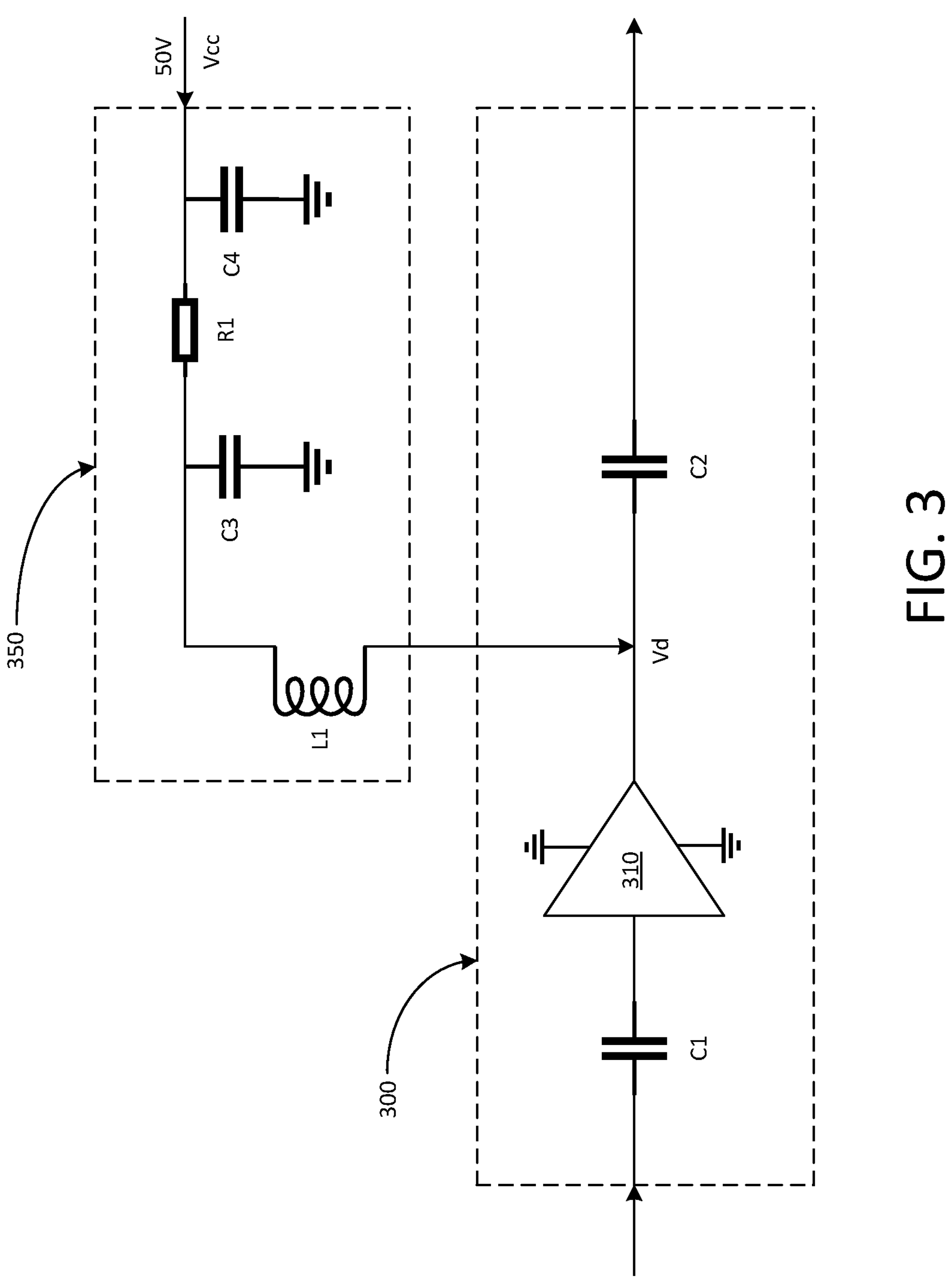
FIG. 3 is a conceptual circuit diagram of the driver stage and driver limiter of the microwave generator of FIG. 2, in accordance with aspects of this disclosure.

FIG. 3 is a conceptual circuit diagram of driver stage 300 and driver limiter 350 of microwave generator 200, in accordance with aspects of this disclosure. The primary component of driver stage 300 is driver transistor 310. In one non-limiting example, driver transistor 310 is a high power GaN (gallium nitride) on silicon HEMT (high electron mobility transistor) D-mode transistor. Driver transistor 310 acts as a high-frequency power amplifier suitable for up to 2.7 GHz operation (2.45 GHz nominal operation) and supports both carrier wave (CW) and pulsed operation with peak output power levels of up to 15 W (which is the reason for driver limiter 350). It is made by depositing a layer of GaN semiconductor material on a silicon substrate. The HEMT structure enhances electron mobility and reduces parasitic resistance, which results in high gain, high efficiency, and high-power handling capability. "D-mode" refers to the transistor's output power polarization, which is typically differential, making it suitable for applications where the signals are high-frequency and require balanced transmission.

Capacitor C1 is coupled in series between the output RF signal from pre-driver stage 220 and the input to driver transistor 310. Capacitor C2 is coupled in series between the output of driver transistor 310 and output stage 230. Capacitors C1 and C2 have component values chosen to ensure that driver stage 300 remains stable and spurious free in view of the lower control voltage provided by driver limiter 350 (e.g., about 43V). The input RF signal to capacitor C1 from pre-driver stage 220 is on the order of 1 W and may be a carrier wave (CW) or pulsed RF signal. The component values of capacitors C1 and C2 are chosen for stability and to have the lowest values possible that do not attenuate the passband frequency of about 2.4 GHz.

Without driver limiter 350 (i.e, if driver transistor 310 were controlled directly by the DC voltage supply), driver transistor 310 is capable of power output of up to about 15 W, which is approximately 4 W over the maximum input power rating (about 11 W) of output stage power amplifier 232. This overdrive possibility, for both "in band" and "out of band" frequencies, can result in catastrophic failure of power amplifier 232. Beyond the possibility of catastrophic failure, excessive overdrive of power amplifier 232 may cause permanent degradation of the output power amplifier transistor die resulting in lower power amplifier output performance and permanent bias threshold drift. Thus, driver limiter 350, which limits and optimizes the output power of driver transistor 310, is essential for long term power amplifier reliability.

Driver limiter 350 controls driver transistor 310 to have the optimum amount of output power (in one example, 11 W+/−0.5 W) for driving power amplifier 232 of output stage 230 to its maximum power output (in one example, about 250 W) without exceeding the maximum input power rating of power amplifier 232 (in one example, about 11 W) and thereby possibly causing damage to or failure of power amplifier 232. Driver limiter 350 sets the output power of driver transistor 310 in this manner without introducing RF instability and spurious outputs.

Driver limiter 350 modifies (lowers) the DC voltage supplied by power supply 104 to a lower control voltage before it is applied to the base terminal of drive transistor 310. The control voltage applied to the base terminal of drive transistor 310 controls the base current, which in turn controls the collector current and hence the output power of drive transistor 310. The DC control voltage is lowered by coupling a resistor R1 between the DC power supply and driver transistor 310 to thereby dissipate power and drop the DC voltage level on the output side of resistor R1. This reduced DC control voltage is then supplied to the base terminal of driver transistor 310 to set the output power of driver transistor 310 to an optimum level that both drives power amplifier 232 to its maximum power output and remains below the maximum input power rating of power amplifier 232. In one non-limiting example, R1 has a value of about 13 ohms, which dissipates sufficient power to reduce the DC voltage from about 50V on the input node of R1 to about 43V on the output node of R1 before being applied to driver transistor 310.

The value of resistor R1 can advantageously be set to fine tune the output power of driver transistor 310. The R1 resistance can be provided by a single resistor or, alternatively, may be provided by multiple resistors. In one non-limiting example, R1 comprises six 2.2-ohm resistors connected in series to provide a total resistance of 13.2 ohms. Use of multiple resistors rather than a single resistor may allow for finer tuning of the driver stage output power and may also help to overcome existing board space limitations for microwave generator 200. The value of resistance R1 can be set, for example, using the E96 series of resistors, which provides 96 different resistance values for each decade, ranging from the first decade (1 ohm to 9.76 ohms) to the ninth decade (910 ohms to 999.04 ohms). The result is that driver limiter 350 is very finely adjustable—almost any resistance value is possible—to ensure full power from output stage 230 without overloading output stage 230.

The component value of capacitor C3, which is coupled between the output node of resistor R1 and ground, is chosen to stabilize the power provided to driver transistor 310, to attenuate RF leakage, and to provide a properly shaped pulse when the driver waveform is pulsed. In particular, the value of capacitor C3 is tuned to minimize overshoot and undershoot as the input RF signal is modulated on and off while still providing sufficient RF filtering on the power supply feed. In one non-limiting example, the value of capacitor C3 is set as 0.1 microfarads. Capacitor C3 may be placed in parallel with a shunt resistor to suppress high-frequency noise.

Capacitor C4, which is coupled between the input node of resistor R1 and ground, is a bulk (high value) capacitor that maintains a stable voltage level, preventing voltage drop and improving power supply stability. Bulk capacitor C4 helps to smooth out any high frequency noise and improves power supply performance.

Inductor L1, which is coupled between the output node of resistor R1 and drive transistor 310, is a choke inductor that prevents ("chokes") RF from going from driver stage 300 into driver limiter 350. Inductor L1 works together with capacitor C3 to prevent RF from coming into resistor R1 and the power supply, i.e., inductor L1 and capacitor C3 act in concert as an RF filter.

Driver limiter 350 provides many advantages. It sets and controls the output power of driver stage 300 to be an optimum amount (in one example, 11 W+/−0.5 W) for driving power amplifier 232 to its maximum power output (in one example, about 250 W) without exceeding the maximum input power rating of power amplifier 232 and possibly causing damage. This is accomplished without introducing RF instability and spurious outputs. Driver limiter 350 allows for easy adjustment of the output power of driver stage 300 to compensate for part-to-part output power variation that may occur during part manufacturing. Driver limiter 350 limits the output power of driver stage 300 without introducing any output power regulation loop control issues, i.e., its output power characteristics are monotonic, without introducing any driver stage or power amplifier gain or maximum saturated output power frequency variation, and without introducing large overshoots or undershoots in output power when the input RF signal is modulated on and off with up to 100% pulse modulation.

Figure 4:
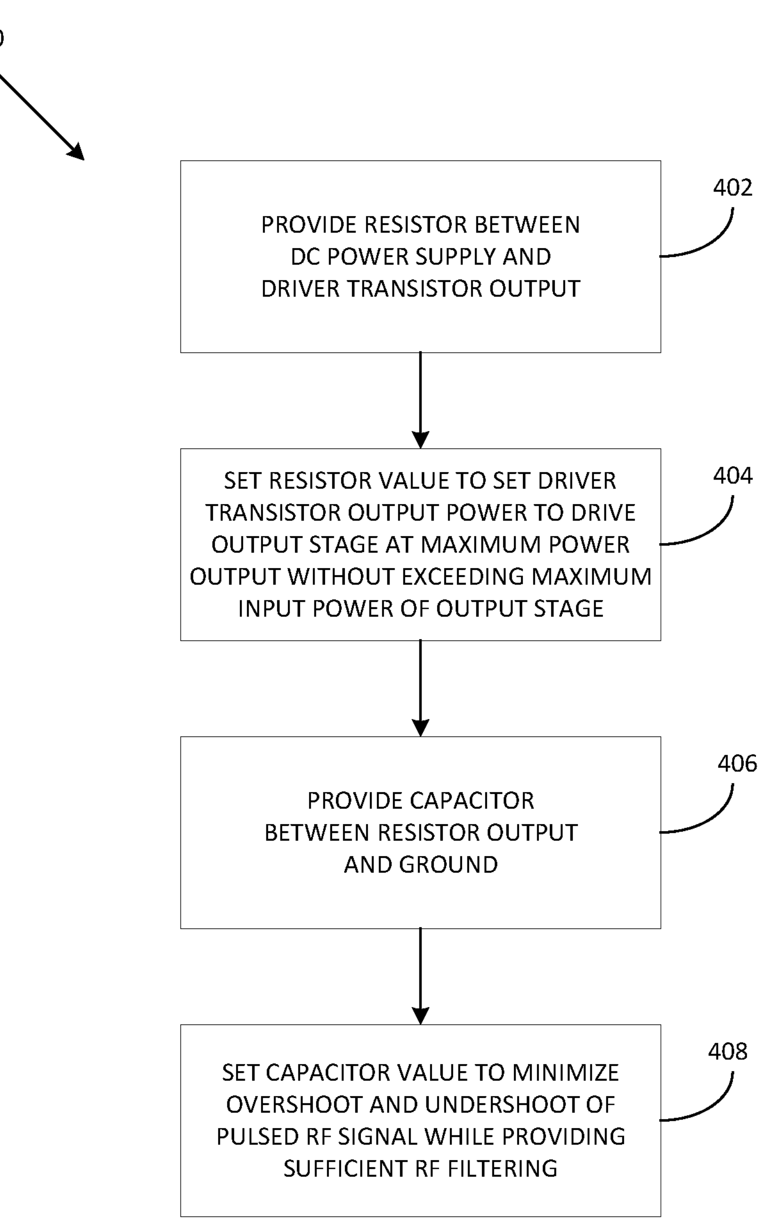
FIG. 4 is a flowchart of a method for optimizing the output power of the driver stage of FIG. 3, in accordance with aspects of this disclosure

FIG. 4 is a flowchart of a method 400 for optimizing the output power of driver transistor 310 of microwave generator 200, in accordance with aspects of this disclosure. In step 402, resistor R1 is provided between the DC power supply (50V) and driver transistor 310. A choke inductor L1 may also be provided between the output of resistor R1 and the output of driver transistor 310 to prevent leakage of RF into driver limiter 350.

In step 404, the value of resistor R1 is chosen to set the output power of driver transistor 310 to drive power amplifier 232 of output stage 230 at its maximum power output without exceeding the maximum input power of power amplifier 232, that is, to drive power amplifier 232 at its maximum without damaging power amplifier 232. As described above, setting R1 to about 13 ohms drops the DC control voltage applied to the base terminal of driver transistor 310 from about 50V to about 43V, which causes the output power of driver transistor 310 to be about 11 W (+/−0.5 W), which is a sufficient input power to driver power amplifier 232 at its maximum power output of 250V without causing damage. The output power of driver transistor 310 may be finely tuned by adjusting the value of resistor R1, which may be implemented if desired by multiple resistors in series.

In step 406, capacitor C3 is coupled between the output of resistor R1 and ground, and in step 408 the value of capacitor C3 is set to minimize overshoot and undershoot of a pulsed RF signal while also providing sufficient RF filtering. As described above, in one implementation, the value of capacitor C3 is set to be about 0.1 microfarads.

After setting the resistance and capacitance values in driver limiter 350 as described above, driver limiter 350 and driver stage 300 were tested at the highest power amplifier input power and at all frequencies, including lower out-of-band frequencies. Despite applying 10 dB higher input overdrive levels, output stage 230 remained undamaged. The saturated output power of power amplifier 232 was also confirmed to be at its maximum level. Only a narrow range of resistance values, as described above, satisfies both providing maximum output power from output stage 230 while sufficiently limiting the output power of driver transistor 310 to prevent damage to output stage 230. The output power of amplifier 232 was confirmed to be stable with no measurable output power variation. The power amplifier output RF stability and spurious was confirmed to be better than 55 dBc.

In sum, driver limiter 350 limits and optimizes the output power of driver stage 300 to not exceed the maximum input power rating of output stage power amplifier 232 while still being sufficient to drive power amplifier 232 to its maximum output power. The output power of driver stage 300 can be adjusted in fine steps by adjustment of the driver limiter resistance, to find the narrow range of driver output power that still allows the output stage power amplifier to reach maximum output power without damage. Driver limiter 350 has been demonstrated to work at high microwave frequencies (i.e., 2.45 GHz) and at high power levels (i.e., 15 W), and as part of an output power regulation loop in a semiconductor plasma generator application, which is prone to large changes in load impedance due to plasma ignition.

Those of skill in the art will understand that information and signals may be represented using any of a variety of different technologies and techniques. For example, data, instructions, commands, information, signals, bits, symbols, and chips that are referenced in this description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. The various illustrative logical blocks, modules, and circuits described herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 5:
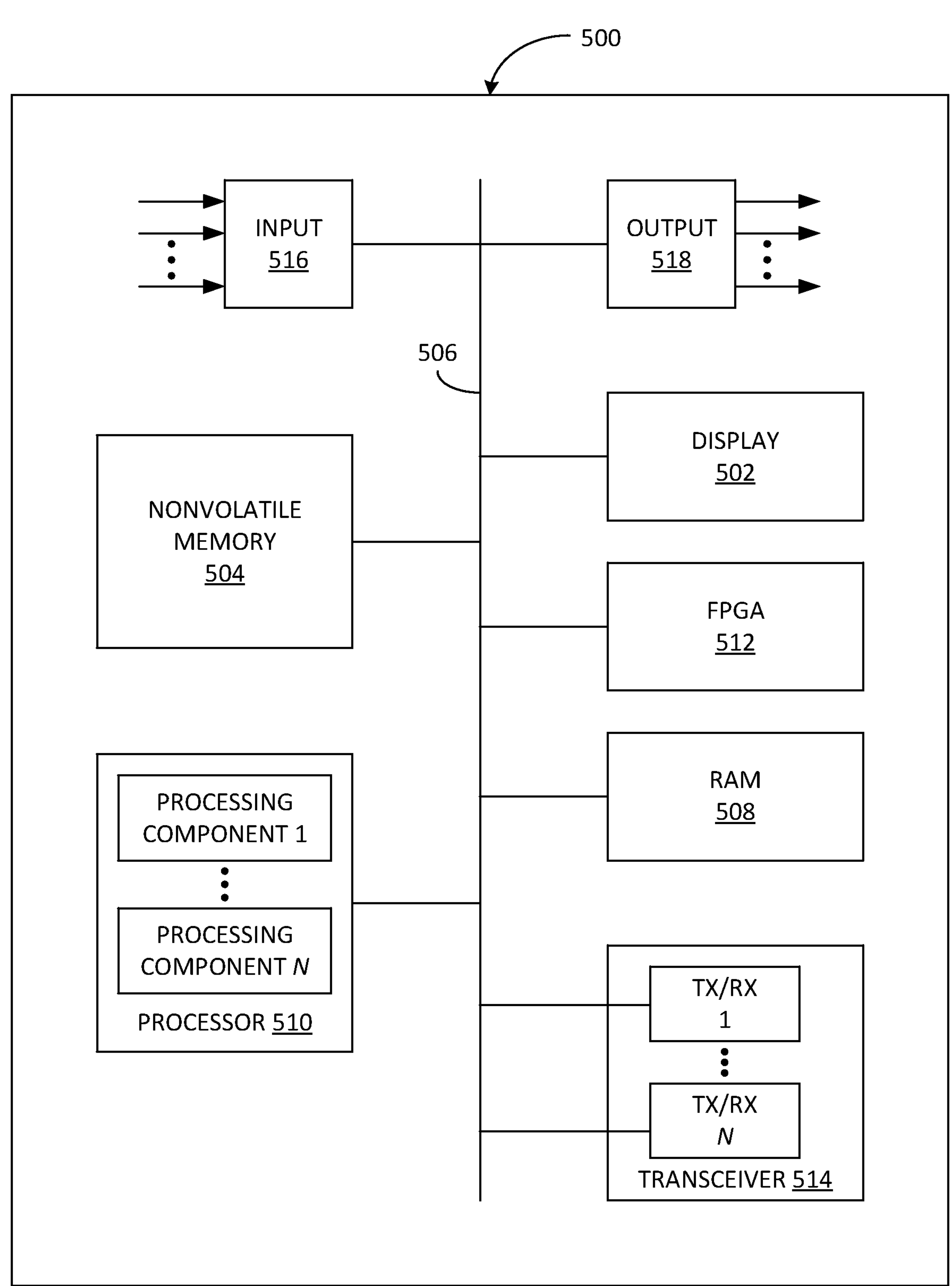
FIG. 5 is a conceptual block diagram depicting a computing system that may be utilized in connection with embodiments disclosed herein.

FIG. 5 is a conceptual diagram of a computing system 500 that may be utilized in connection with the embodiments disclosed herein. Display 502 and nonvolatile memory 504 are coupled to bus 506 that is also coupled to random access memory (RAM) 508, processor 510 that includes N processing components, field programmable gate array (FPGA) 512, and transceiver 514 that includes N transceivers. Although the components depicted in FIG. 5 represent physical components, FIG. 5 is not intended to be a detailed hardware diagram; thus, many of the components depicted in FIG. 5 may be realized by common constructs or distributed among additional physical components. Moreover, it is contemplated that other existing and yet-to-be developed physical components and architectures may be utilized to implement the functional components described with reference to FIG. 5.

Display 502 generally operates to provide a user interface, and in some implementations, is realized by a touchscreen display. Nonvolatile memory 504 is generally a non-transitory memory that functions to persistently store data and machine readable (e.g., processor executable) code, including executable code that is associated with effectuating the methods described herein. In some embodiments, nonvolatile memory 504 includes bootloader code, operating system code, file system code, and non-transitory processor-executable code to facilitate execution of the methods described herein including method 400 of FIG. 4.

In some implementations, nonvolatile memory 504 is realized by flash memory (e.g., NAND or ONENAND memory), but it is contemplated that other memory types may be utilized as well. Although it may be possible to execute the code from nonvolatile memory 504, the executable code in nonvolatile memory 504 is typically loaded into RAM 508 and executed by one or more of the N processing components in processor 510.

In operation, processor 510 in association with RAM 508 may generally operate to execute the instructions stored in nonvolatile memory 504 to realize aspects of this disclosure. For example, non-transitory processor-executable instructions to effectuate aspects of method 400 of FIG. 4 may be persistently stored in nonvolatile memory 504 and executed by processor 510 in association with RAM 508. As one of ordinarily skill in the art will appreciate, processor 510 may include a video processor, digital signal processor (DSP), graphics processing unit (GPU), and other processing components.

In addition, or in the alternative, FPGA 512 may be configured to effectuate one or more aspects of the methods described herein (e.g., method 400 of FIG. 4). For example, non-transitory FPGA configuration instructions may be persistently stored in nonvolatile memory 504 and accessed by FPGA 512 (e.g., during boot up) to configure FPGA 512 to realize aspects of method 400.

Input component 516 may operate to receive signals that are indicative of one or more aspects of power such as, for example, voltage and current. Output component 518 generally operates to provide one or more analog or digital signals to effectuate operational aspects of the power controller systems described herein.

Transceiver 514 includes N transceiver chains, which may be used for communicating with external devices via wireless or wired networks. Each of the N transceiver chains may represent a transceiver associated with a particular communication scheme (e.g., WiFi, Ethernet, Profibus, etc.).

This disclosure is provided to enable any person skilled in the art to make or use the embodiments described herein. Various modifications will be readily apparent to those skilled in the art, and the principles disclosed herein may be applied to other embodiments without departing from the spirit or scope of this disclosure. While certain embodiments are described herein, these embodiments are presented by way of example only and do not limit the scope of this disclosure.

The invention claimed is:

1. A microwave power generator comprising:

a regulated control loop comprising:

- a driver stage comprising a driver transistor, the driver stage is configured to receive a source signal that varies based upon a setpoint;
- an output stage comprising a power amplifier configured to receive an amplified representation of the source signal from the driver stage; and
- a driver limiter configured to be coupled between the driver stage and a DC voltage supply, the driver limiter comprising a resistor coupled between the DC voltage supply and the driver transistor;
- wherein the resistor has a resistance value effective to reduce a DC voltage supplied by the DC voltage supply to a control voltage that is applied to the driver transistor to set an output power of the driver transistor at a level effective to drive the power amplifier of the output stage to its maximum output power without exceeding a maximum input power rating of the power amplifier.

2. The microwave power generator as claimed in claim 1, wherein:

the resistance value of the resistor is about 13 ohms;

the DC voltage supplied by the DC voltage supply is about 50 volts;

the control voltage applied to the driver transistor is about 43 volts; and the output power of the driver transistor is about 11 watts.

3. The microwave power generator as claimed in claim 2, wherein the resistor is comprised by six resistors connected in series, wherein each of the six resistors has a resistance of about 2.2 ohms.

4. The microwave power generator as claimed in claim 1, wherein the driver stage further comprises:

a first capacitor coupled between an input node of the driver stage and the driver transistor; and a second capacitor coupled between the driver transistor and an output node of the driver stage, wherein the first and second capacitors have values that keep the driver stage stable and spurious free without attenuating a passband frequency of the driver stage.

5. The microwave power generator as claimed in claim 4, wherein the driver limiter further comprises a third capacitor coupled between an output node of the resistor and ground, and the third capacitor has a capacitance value effective to minimize overshoot and undershoot of a pulsed RF signal while providing sufficient RF filtering.

6. The microwave power generator as claimed in claim 5, wherein the capacitance value of the third capacitor is approximately 0.1 microfarads.

7. The microwave power generator as claimed in claim 5, wherein the driver limiter further comprises a choke inductor coupled between the output node of the resistor and the driver transistor, and the choke inductor prevents RF leakage from the driver stage into the driver limiter stage.

8. The microwave power generator as claimed in claim 7, wherein the driver limiter further comprises a fourth capacitor coupled between the input node to the resistor and ground, the fourth capacitor having a bulk capacitance value that maintains a stable voltage level and smooths out any high frequency noise.

9. The microwave power generator as claimed in claim 1, wherein the driver transistor is a gallium nitride transistor having a peak frequency of about 2.7 GHZ and a peak output power level of about 15 W.

10. A method for applying output power to a plasma load, the method comprising:

receiving a setpoint for the output power;

producing a source signal with an attenuation stage and pre-driver stage that varies based upon the setpoint;

receiving, at a driver stage, the source signal and producing an amplified representation of the source signal;

coupling a resistor between a DC power supply and a driver transistor of the driver stage;

setting a resistance value of the resistor to provide a control voltage at an output node of the resistor that is reduced relative to an output voltage of the DC power supply; and applying the control voltage to the driver transistor to set the output power of the driver transistor at a level effective to drive, with the amplified representation of the source signal, a power amplifier of an output stage coupled to the driver transistor to its maximum output power without exceeding a maximum input power rating of the power amplifier.

11. The method as claimed in claim 10, wherein:

the output voltage of the DC power supply is about 50 volts;

the resistance value of the resistor is set to be about 13 ohms; and the control voltage at the output node of the resistor is about 43 volts.

12. The method as claimed in claim 10, further comprising:

coupling a first capacitor to an input of the driver transistor;

coupling a second capacitor to an output of the driver transistor; and setting values of the first and second capacitors to keep the output power of the driver transistor stable and spurious free without attenuating a passband frequency of the driver stage.

13. The method as claimed in claim 12, further comprising:

coupling a third capacitor coupled between the output node of the resistor and ground, and setting a capacitance value of the third capacitor to be effective to minimize overshoot and undershoot of a pulsed RF signal while providing sufficient RF filtering.

14. The method as claimed in claim 13, further comprising:

coupling a choke inductor between the output node of the resistor and the driver transistor to prevent RF leakage from the driver transistor into the resistor and the DC power supply.

15. The method as claimed in claim 14, further comprising:

coupling a fourth capacitor between an input node to the resistor and ground that has a bulk capacitance value that maintains a stable voltage level and smooths out any high frequency noise.

16. A driver limiter for a driver transistor of a microwave power generator comprising:

a resistor coupled between a DC voltage supply and the driver transistor, wherein the resistor reduces a DC voltage supplied by the DC voltage supply to a control voltage that is applied to the driver transistor to set an output power of the driver transistor at a level effective to drive a power amplifier of an output stage of the microwave power generator to its maximum output power without exceeding a maximum input power rating of the power amplifier.

17. The driver limiter as claimed in claim 16, wherein the resistor has a resistance of about 13 ohms.

18. The driver limiter as claimed in claim 16, wherein the resistor comprises six resistors coupled in series between the DC power supply and the driver transistor, wherein each of the six resistors has a resistance of about 2.2 ohms.

19. The driver limiter as claimed in claim 16, further comprising:

RF filtering means coupled between the resistor and the driver transistor, wherein the RF filtering means minimizes overshoot and undershoot of a pulsed RF signal and prevents RF leakage from the driver transistor into the resistor and the DC power supply.

20. The driver limiter as claimed in claim 19, wherein the RF filtering means comprises:

a capacitor coupled between the resistor and ground; and a choke inductor coupled between the resistor and the driver transistor.

* * * * *